United States Patent [19]
Andrejack et al.

[11] Patent Number: 5,489,500
[45] Date of Patent: Feb. 6, 1996

[54] FLEXIBLE STRIP STRUCTURE FOR A PARALLEL PROCESSOR AND METHOD OF FABRICATING THE FLEXIBLE STRIP

[75] Inventors: John Andrejack, Cincinatti, Ohio; Natalie B. Feilchenfeld, Endwell, N.Y.; David B. Stone, Owego, N.Y.; Paul G. Wilkin, Endicott, N.Y.; Michael Wozniak, Vestal, N.Y.

[73] Assignee: International Business Machines, Inc., Armonk, N.Y.

[21] Appl. No.: 97,601

[22] Filed: Jul. 27, 1993

[51] Int. Cl.$^6$ ........................................ G03F 7/26
[52] U.S. Cl. .................. 430/313; 430/317; 430/318; 430/311
[58] Field of Search ............................ 430/311, 313, 430/314, 316, 317, 318, 330

[56] References Cited

U.S. PATENT DOCUMENTS

| | | | |
|---|---|---|---|
| 4,446,188 | 5/1984 | Patel | 428/138 |
| 5,146,674 | 9/1992 | Frankeny | 29/830 |
| 5,306,874 | 4/1994 | Biron | 174/262 |

*Primary Examiner*—Kathleen Duda
*Attorney, Agent, or Firm*—Richard M. Goldman

[57] ABSTRACT

Disclosed is a parallel processor packaging structure and a method for manufacturing the structure. The individual logic and memory elements are on printed circuit cards. These printed circuit boards and cards are, in turn, mounted on or connected to circuitized flexible substrates extending outwardly from a laminate of the circuitized, flexible substrates. Intercommunication is provided through a switch structure that is implemented in the laminate. The printed circuit cards are mounted on or connected to a plurality of circuitized flexible substrates, with one printed circuit card at each end of the circuitized flexible circuit. The circuitized flexible substrates connect the separate printed circuit boards and cards through the central laminate portion. This laminate portion provides XY plane and Z-axis interconnection for inter-processor, inter-memory, inter-processor/memory element, and processor to memory bussing interconnection, and communication. The planar circuitization, as data lines, address lines, and control lines of a logic chip or a memory chip are on the individual printed circuit boards and cards, which are connected through the circuitized flex, and communicate with other layers of flex through Z-axis circuitization (vias and through holes) in the laminate. The individual circuitized flexible strips are discrete subassemblies. These subassemblies are laminates of at least one internal power core, and at least one signal core, with a layer of dielectric between.

3 Claims, 5 Drawing Sheets

FLEXIBLE STRIP STRUCTURE FOR A PARALLEL PROCESSOR AND METHOD OF FABRICATING THE FLEXIBLE STRIP

CROSS REFERENCE TO RELATED APPLICATIONS

This application is related to the following commonly assigned United States patent applications:

U.S. patent application Ser. No. 08/097544, filed Jul. 27, 1993, by Charles Davis, Thomas, Duffy, Steven Hankovic, Howard Heck, John Kolias, and John Kresge, David Light, and Ajit Trevidi for *Method of Fabricating A Flex Laminate Package* (Attorney Docket Number EN993034).

U.S. patent application Ser. No. 08/097744, filed Jul. 27, 1993, by Raymond T. Galasco and Jayanal T. Molla for *Solder Bonded Parallel Processor Package Structure and Method of Solder Bonding* (Attorney Docket Number EN993035).

U.S. patent application Ser. No. 08/097810, filed Jul. 27, 1993, by Thomas Gall and James Wilcox for *Method and Apparatus for Electrodeposition* (Attorney Docket Number EN993036).

U.S. patent application Ser. No. 08/098085, filed Jul. 27, 1993, by Robert D. Edwards, Frank D. Egitto, Thomas P. Gall, Paul S. Gursky, David E. Houser, James S. Kamperman, and Warren R. Wrenner for *Method of Drilling Vias and Through Holes* (Attorney Docket Number EN993037).

U.S. patent application Ser. No. 08/097606, filed Jul. 27, 1993, by John H. C. Lee, Ganesh Subbaryan, and Paul G. Wilkin for *Electromagnetic Bounce Back Braking for Punch Press and Punch Press Process* (Attorney Docket Number EN993038).

U.S. patent application Ser. No. 08/098485, filed Jul. 27, 1993, by Thomas Gall, Howard Heck, and John Kresge for *Parallel Processor and Method of Fabrication* (Attorney Docket Number EN993039).

U.S. patent application Ser. No. 08/097520, filed Jul. 27, 1993, by Thomas Gall and James Loomis for *Parallel Processor Structure and Package* (Attorney Docket Number EN993040).

U.S. patent application Ser. No. 08/097605, filed Jul. 27, 1993, by Chi-Shi Chang and John P. Koons for *Parallel Processor Bus Structure and Package Incorporating The Bus Structure* (Attorney Docket Number EN993042).

U.S. patent application Ser. No. 08/097603, filed Jul. 27, 1993, by Thomas Gall, James Loomis, David B. Stone, Cheryl L. Tytran, and James R. Wilcox for *Fabrication Tool and Method for Parallel Processor Structure and Package* (Attorney Docket Number EN993043).

U.S. patent application Ser. No. 08/097604, filed Jul. 27, 1993, by Donald Lazzarini and Harold Kohn for *Method of Fabricating A Parallel Processor Package* (Attorney Docket Number EN993045).

FIELD OF THE INVENTION

The invention relates to parallel processors. More particularly the invention relates to parallel processors having a plurality of printed circuit cards and/or boards, e.g., dedicated printed circuit cards and/or boards, for carrying processors, memory, and processor/memory elements, mounted on and interconnected through a plurality of circuitized flexible cable substrates, i.e., flex strips. The circuitized flexible cable substrates, i.e., flex strips, connect the separate printed circuit boards and cards through a central laminate portion. This central laminate portion provides Z-axis, layer to layer means for inter-processor, inter-memory, inter-processor/memory element, and processor to memory bussing interconnection, and communication through vias and through holes extending from flex strip to flex strip through the laminate. According to the invention the flex strips are built up from 1S1P elements.

BACKGROUND OF THE INVENTION

Parallel processors have a plurality of individual processors, all capable of cooperating on the same program. Parallel processors can be divided into Multiple Instruction Multiple Data (MIMD) and Single Instruction Multiple Data (SIMD) designs.

Multiple Instruction Multiple Data (MIMD) parallel processors have individual processing nodes characterized by fast microprocessors supported by many memory chips and a memory hierarchy. High performance inter node communications coprocessor chips provide the communications links to other microprocessors. Each processor node runs an operating system kernel, with communications at the application level being through a standardized library of message passing functions. In the MIMD parallel processor both shared and distributed memory models are supported.

Single Instruction Multiple Data (SIMD) parallel processors have a plurality of individual processor elements under the control of a single control unit and connected by an intercommunication unit. SIMD machines have an architecture that is specified by:

1. The number of processing elements in the machine.
2. The number of instructions that can be directly executed by the control unit. This includes both scalar instructions and program flow instructions.
3. The number of instructions broadcast by the control unit to all of the processor elements for parallel execution. This includes arithmetic, logic, data routing, masking, and local operations executed by each active processor element over data within the processor element.
4. The number of masking schemes, where each mask partitions the set of processor elements into enabled and disabled subsets.
5. The number of data routing functions, which specify the patterns to be set up in the interconnection network for inter-processor element communications.

SIMD processors have a large number of specialized support chips to support dozens to hundreds of fixed point data flows. Instructions come from outside the individual node, and distributed memory is supported.

Parallel processors require a complex and sophisticated intercommunication network for processor-processor and processor-memory communications. The topology of the interconnection network can be either static or dynamic. Static networks are formed of point-to-point direct connections which will not change during program execution. Dynamic networks are implemented with switched channels which can dynamically reconfigure to match the communications requirements of the programs running on the parallel processor.

Dynamic networks are particularly preferred for multipurpose and general purpose applications, Dynamic networks can implement communications patterns based on a program demands. Dynamic networking is provided by one or more of bus systems, multistage intercommunications networks, and crossbar switch networks.

Critical to all parallel processors, and especially to dynamic networks is the packaging of the interconnection circuitry. Specifically, the interconnection must provide high speed switching, with low signal attenuation, low crosstalk, and low noise.

SUMMARY OF THE INVENTION

The invention relates to parallel processors, and more particularly to parallel processors having a plurality of printed circuit cards and/or boards, e.g., dedicated printed circuit cards and/or boards, for carrying processors, memory, and processor/memory elements. The printed circuit cards and/or boards are mounted on a plurality of circuitized flexible substrates, i.e., flex strips. The circuitized flexible substrates connect the separate printed circuit boards and cards through a relatively rigid central laminate portion. This central laminate portion provides means, e.g. Z-axis means, for inter-processor, inter-memory, inter-processor/memory element, and processor to memory bussing interconnection, and communication.

Parallel processor systems have a plurality of individual processors, e.g., microprocessors, and a plurality of memory modules. The processors and the memory can be arrayed in one of several interconnection topologies, e.g., an SIMD (single instruction/multiple data) or an MIMD (multiple instruction/multiple data).

The memory modules and the microprocessors communicate through various topologies, as hypercubes, and toroidal networks, solely by way of exemplification and not limitation, among others. These inter-element communication topologies have various physical realizations. According to the invention described herein, the individual logic and memory elements are on printed circuit boards and cards. These printed circuit boards and cards are, in turn, mounted on or otherwise connected to circuitized flexible substrates extending outwardly from a relatively rigid, circuitized laminate of the individual circuitized flexible substrates. The intercommunication is provided through a switch structure that is implemented in the laminate. This switch structure, which connects each microprocessor to each and every other microprocessor in the parallel processor, and to each memory module in the parallel processor, has the physical structure shown in FIG. 1 and the logical/electrical structure shown in FIG. 2.

More particularly, the preferred physical embodiment of this electrical and logical structure is a multilayer switch structure shown in FIG. 1. This switch structure provides separate layers of flex 21 for each unit or pairs of units, that is, each microprocessor, each memory module, or each microprocessor/memory element. The planar circuitization, as data lines, address lines, and control lines are on the individual printed circuit boards and cards 25, which are connected through the circuitized flex 21, and communicate with other layers of flex through Z-axis circuitization (vias and through holes) in the central laminate portion 21 in FIG. 1. The bus structure is illustrated in FIG. 2, which shows a single bus, e.g., a data bus as the A Bus, the B Bus, or the O Bus, connecting a plurality of memory units through a bus, represented by OR-gates, to four processors. The Address Bus, Address Decoding Logic, and Read/Write Logic are not shown. The portion of the parallel processor represented by the OR gates, the inputs to the OR gates, and the outputs from the OR gates is carried by the laminated flex structure 41.

Structurally the parallel processor 11 has a plurality of integrated circuit chips 29, as processor chips 29a mounted on a plurality of printed circuit boards and cards 25. For example, the parallel processor structure 11 of our invention includes a first processor integrated circuit printed circuit board 25 having a first processor integrated circuit chip 29a mounted thereon and a second processor integrated circuit printed circuit board 25 having a second processor integrated circuit chip 29a mounted thereon.

Analogous structures exist for the memory integrated circuit chips 29b, the parallel processor 11 having a plurality of memory chips 29b mounted on a plurality of printed circuit boards and cards 25. In a structure that is similar to that for the processor chips, the parallel processor 11 of our invention includes a first memory integrated circuit printed circuit board 25 having a first memory integrated circuit chip 29b mounted thereon, and a second memory integrated circuit printed circuit board 25 having a second memory integrated circuit chip 29b mounted thereon.

Mechanical and electrical interconnection is provided between the integrated circuit chips 29 mounted on different printed circuit boards or cards 25 by a plurality of circuitized flexible strips 21. These circuitized flexible strips 21 each have a signal interconnection circuitization portion 211, a terminal portion 213 adapted for carrying a printed circuit board or card 25, and a flexible, circuitized portion 212 between the signal interconnection circuitization portion 211 and the terminal portion 213. The signal interconnection circuitization portion 211, has X–Y planar circuitization 214 and vias and through holes 215 for Z-axis circuitization.

The flexible circuitized strips 21 are laminated at their signal interconnection circuitization portion 211. This interconnection portion is built up as lamination of the individual circuitized flexible strips 21, and has X-axis, Y-axis, and Z-axis signal interconnection between the processor integrated circuit chips 29a and the memory integrated circuit chips 29b. In the resulting structure the circuitized flexible strips 21 are laminated in physical and electrical connection at their signal interconnection circuitization portions 211 and spaced apart at their terminal portions 213.

According to our invention the individual circuitized flexible strips 21 are formed of discrete 1S1P (one signal plane, one power plane) subassemblies. These subassemblies are themselves a laminate of at least one internal power core 221, at least one signal core 222, with a layer of dielectric 223 therebetween. The dielectric 223 is a polymeric dielectric having a dielectric constant less than 3.5, as a polyimide or a perfluorocarbon polymer, or, in a preferred exemplification, a multi-phase composite of a polymeric dielectric material having a low dielectric constant and having a low dielectric constant, low coefficient of thermal expansion material dispersed therethrough. Preferably the composite has a dielectric constant less than 3.5, and preferably below about 3.0, and in a particularly preferred embodiment below about 2.0. This is achieved by the use of a low dielectric constant pefluorocarbon polymer matrix, filled with a low dielectric constant and low coefficient of thermal expansion filler. The perfluorocarbon polymer is chosen from the group consisting of perfluoroethylene, perfluoroalkoxies, and copolymers thereof. The dispersed low dielectric constant material is a low dielectric constant, low coefficient of thermal expansion, particulate filler. Exemplary low dielectric constant particulate filler are chosen from the group consisting of silica particles, silica spheres, hollow silica spheres, aluminum oxide, aluminum nitride, zirconium oxide, titanium oxide, and the like.

The power core 221 may be a copper foil, a molybdenum foil, or a "CIC" (Copper-Invar-Copper) laminate foil. The circuitized flexible strip 21 may be a 1S1P (one signal plane, one power plane) circuitized flexible strip, or a laminate made up of 1S1P (one signal plane, one power plane) plies or subassemblies.

The circuitized flexible strip 21 can have either two terminal portions 213 for carrying printed circuit boards 25 at opposite ends thereof, or a single terminal portion 213 for carrying a printed circuit board 25 at only one end of the circuitized flexible cable 21. Where the circuitized flexible strip 21 is adapted to carry a printed circuit board 25 at only one end, a pair of circuitized flexible strips 21, each having a terminal portion 213 at only one end can be laminated so that their signal interconnection circuitization portions 211 overlap but their terminal portions 213 and their flexible, circuitized 212 portions extend outwardly from opposite sides of the signal interconnection circuitization laminated body portion 41 of the parallel processor package 11.

THE FIGURES

The invention may be understood by reference to the Figures appended hereto.

DETAILED DESCRIPTION OF THE INVENTION

Figure 1:
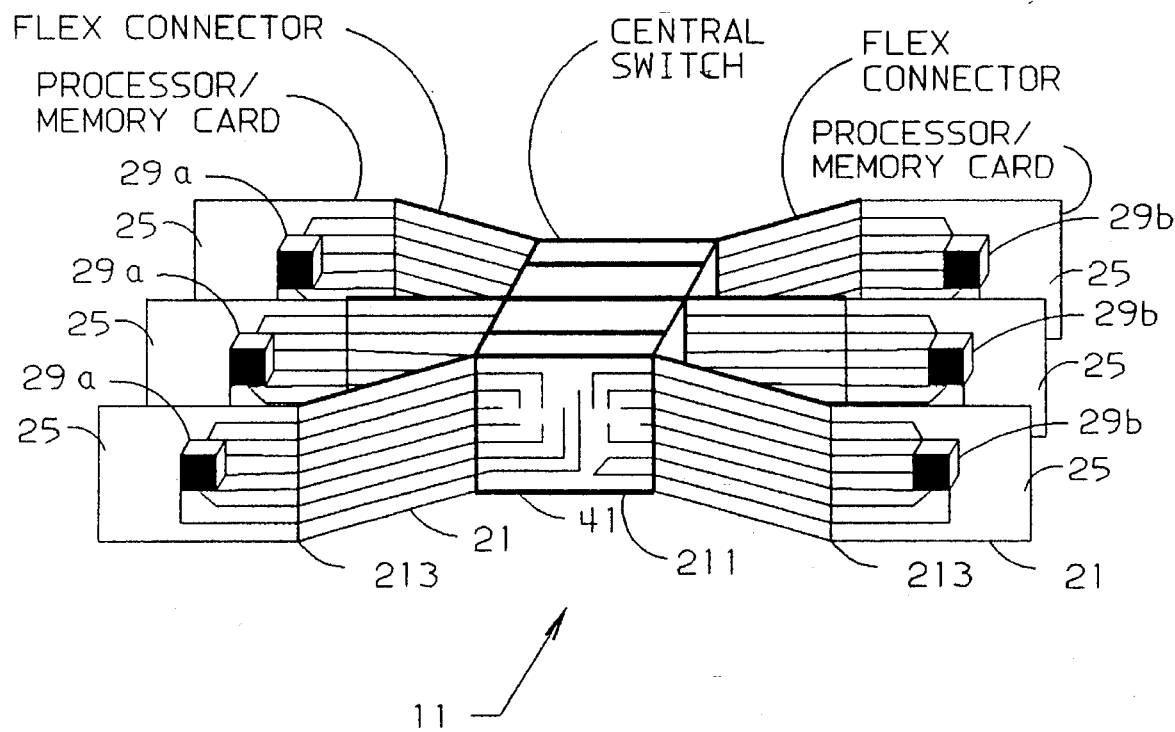
FIG. 1 shows an overview of the mechanical and structural features of the parallel processor package of the invention.

The invention described herein relates to a parallel processor 1 and a parallel processor package 11 having a plurality of integrated circuit chips 29, e.g., microprocessors 29a, preferably advanced microprocessors, and memory modules 29b, mounted on printed circuit cards and boards 25, and connected through a laminate 41 of circuitized flexible strips 21 as will be described herein below. The structure and methods of fabricating the structure and similar structures are useful in parallel processors, in bank switched memory with memory banks or fractional memory banks on an individual flex connector, and for providing flex cable to flex cable connection in a heavily interconnected network.

Advanced microprocessors, such as pipelined microprocessors and RISC (reduced instruction set computer) microprocessors provide dramatic increases in chip level integration and chip level circuit densities. These advanced microprocessors, in turn, place increasing demands on wiring densities and interconnections at the next lower levels of packaging. Moreover, when advanced microprocessors are combined into multi- processor configurations, i.e., parallel processors, as SIMD and MIMD parallel processors, still higher levels of performance, circuit density, including logic density and memory density, and I/O packaging, are all required.

Figure 2:
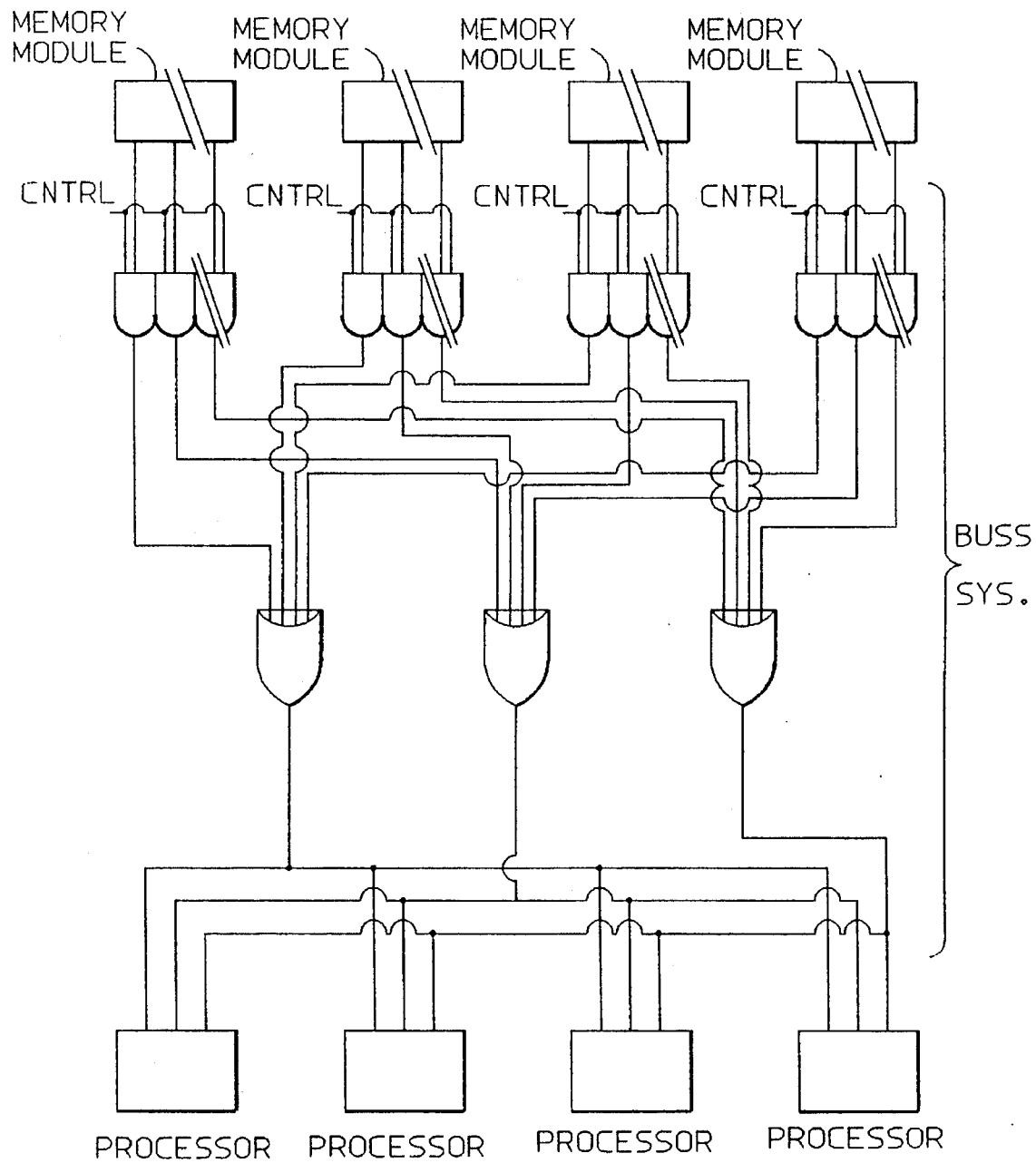
FIG. 2 shows a generalized and simplified schematic of one bus of bus structures that can be implemented in the package of the invention.

The basic parallel processor structure 11 of the invention, e.g., an SIMD or an MIMD parallel processor, builds from a plurality of microprocessors 29a and a plurality of memory modules 29b, with the memory modules 29b and the microprocessors 29a communicating through a laminate switch structure 11. This switch, which connects each microprocessor 29a to each and every other microprocessor 29a in the parallel processor 1, and to each memory module 29b in the parallel processor 1, has the logical/electrical structure shown in FIG. 2.

LAMINATE SWITCH STRUCTURE

Figure 4:
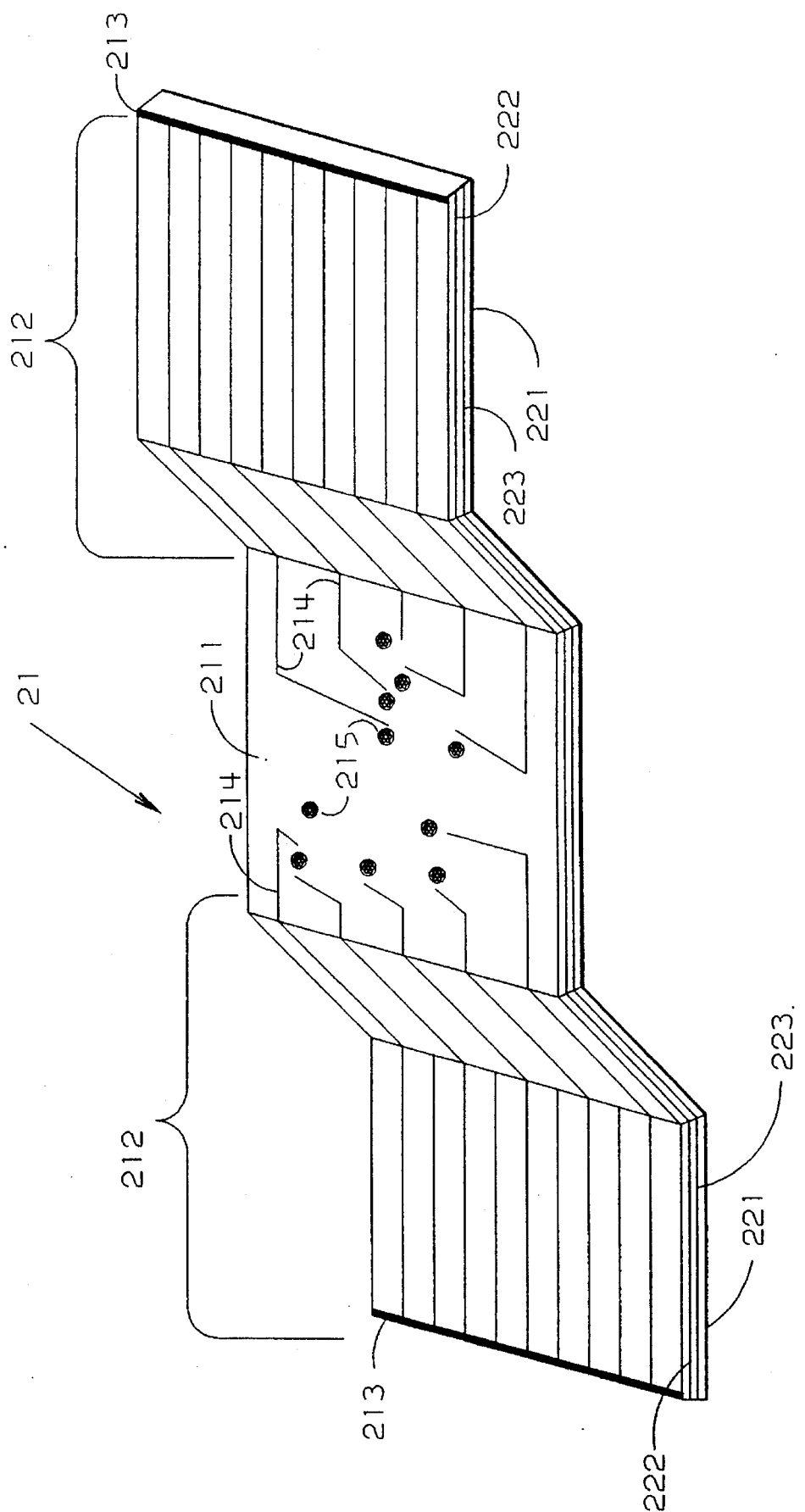
FIG. 4 shows a perspective view of a circuitized flexible strip of the invention having surface circuitization, Pd dendrites for connecting the printed circuit boards or cards thereto, and joining metallurgy, vias, and through holes on the portion intended to be laminated.

The parallel processor package 11 of the invention integrates carrier, connector, and I/O into a single package, with multiple circuitized flexible cables 21 that are built into a carrier cross section 41 using discrete subassemblies 21 which are laminated together to form a Z-axis signal and power connection laminate 41 between the discrete subassemblies 21. A discrete subassembly is shown generally in FIG. 4.

The physical embodiment of the package 11 yields high performance by utilizing high wirability printed circuit board technology that enhances present printed circuit card and board technology for massively parallel processor systems, while providing cost and performances advantages. Both the laminate 41, which we refer to as a central, switch, or rigid portion, and the outwardly extending flex portions 21 (intended for attachment to printed circuit boards or cards 25 carrying the memory modules 29b and the logic modules 29a) are characterized by printed circuit board like cross sections, and a low dielectric constant polymer substrate.

The physical embodiment of this electrical and logical structure encompasses the multilayer laminate switch structure shown in FIG. 1. This switch structure provides a separate layer of flex 21 for each printed circuit board or card 25 or each pair thereof. Each individual printed circuit board or card 25 can carry a microprocessor 29a, a memory module 29b, I/O, or a microprocessor/memory element. The planar circuitization 214, as data lines, address lines, and control lines is on the flex 21, and communicates with other layers of flex 21 through vias and through holes 217 in the laminate central portion 41, shown in FIG. 4.

This laminate flex design provides a large number of I/O's, for example twenty five thousand or more, from the package 11 while eliminating the need for the manufacture, alignment, and bonding of discrete flex cables extending outwardly from a single panel. A conventional planar panel would have to be many times larger to have room for the same connectivity as the integrated flex/rigid/flex or rigid/flex of the invention.

FLEX CARD CARRIERS JOINED AT A CENTRAL LAMINATE SWITCH PORTION

The package 1 of the invention combines a laminate central or switch portion 41 and circuitized flexible strip extensions 21 extending outwardly therefrom and carrying terminal printed circuit boards and cards 25 for circuit elements 29a and 29b, as integrated circuit chips 29, thereon.

Heretofore flex cables and flex carriers have been integrated onto one or two surfaces, i.e., the top surface or the top and bottom surfaces, of a carrier. However, according to the present invention the flex cables 21 are integrated into a central switch or carrier structure 41 as a laminate with a plurality of stacked, circuitized flex strips 21. The area selective lamination of the flex carriers 21 in the central region 211 forms the rigid laminate carrier 41. This laminate region 41 carries the Z-axis circuitization lines from flex 21 to flex 21.

The individual plies of flex 21 have internal conductors, i.e., internal power planes 221 and internal signal planes 222. Additionally, in order to accommodate the narrow dimensional tolerances associated with the high I/O density, high wiring density, and high circuit density, it is necessary to carefully control the Coefficient of Thermal Expansion (CTE) of the individual subassemblies. This is accomplished through the use of an internal metallic conductor 221 of matched coefficient of thermal expansion (CTE), such a molybdenum foil or a Cu/Invar/Cu foil, to which the layers of dielectric 223 are laminated.

The combination of circuitized flex 21 extending outwardly from a central laminate section 41, with vias 215 and through holes 215 electrically connecting separate plies 21 of circuitized flex therethrough, reduces the footprint associated with the chip carrier, as wiring escape is easier.

This structure offers many advantages for a parallel processor, especially a massively parallel processor, as well as any other heavily interconnected system. Among other advantages, a reduced size chip carrier is possible, as escape is made easier, signal transmission lengths are reduced, and discontinuities due to contact mating between chip carrier and flex are reduced and reliability is enhanced as the chip carrier and the flex are a single entity.

The design of the parallel processor package calls for all vertical (Z-axis) connections to be made by bonding a joining alloy, e.g., transient liquid phase bonding Au/Sn, and the organic dielectric, as a perfluoropolymer, into a laminate of circuit panels, while the outwardly extending edges 212 and 213 of the panels 21 are not bonded, so that they can act as circuitized flex cables. This flexibility or bendability allows the printed circuit boards and cards 25 to be offset from one another remote from the laminate 41.

SPECIALIZED CARDS AND BOARDS

The parallel processor package of our invention allows a variety of component types to be mounted on the flexible elements. Specifically, the printed circuit card and board terminated circuitized flex strips are analogous to printed circuit boards and cards mounted in expansion slots in a conventional planar motherboard. The cards and boards at the ends of the circuitized flex strips can include Tape Automated Bonding (TAB) components, e.g., high I/O, fine lead pitch TAB.

Alternatively, surface mount circuitization can be utilized, for example, fine pitch plastic and ceramic surface mount packages.

Alternatively, high I/O area array solder ball connection techniques may be used. One such high I/O area array solder ball connected chip is shown mounted on a card that is, in turn, mounted on a flexible cable in FIG. 5.

According to still further embodiment of the invention chip on board bonding and interconnection may be used.

Figure 5:
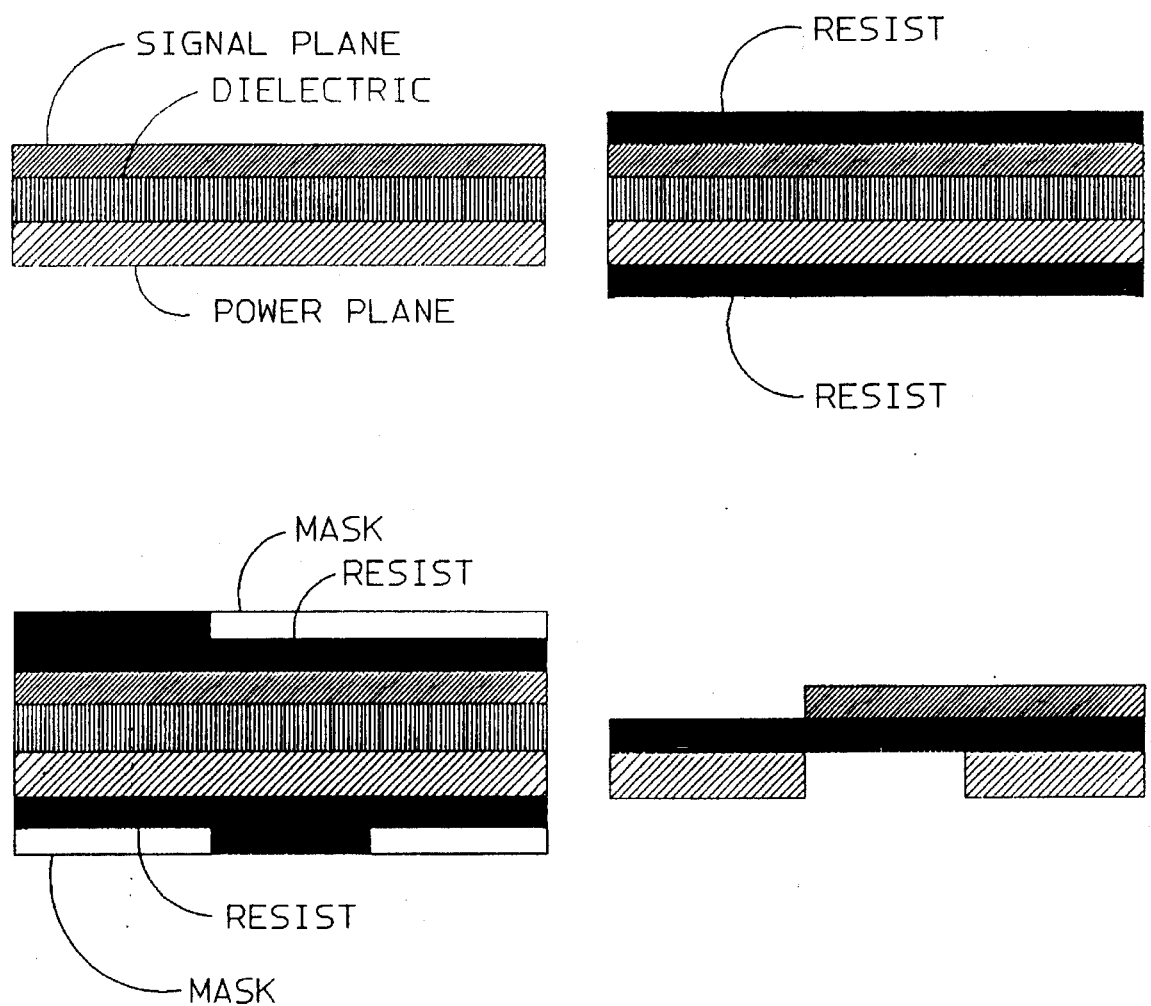
FIG. 5 shows the steps of forming the 1S1P plies and of forming a flex strip therefrom.

According to our invention a 1S1P panel is utilized. The buildup of this panel is shown in FIG. 5. As there shown a layer of a dielectric, with a signal plane (as Cu) and a power plane (as Cu, Mo, or Cu/Invar/Cu). Resist is applied atop the signal plane and the power plane. As shown in the third element of FIG. 5, the resist is masked and imaged, and the exposed metallurgy is etched. As shown in the fourth element of FIG. 5, etching the signal plane leaves room for the power line, while etching the power plane leaves room for the signal line. As shown in the fifth element of FIG. 5, dielectric and cover or release sheets are applied for lamination and seeding. In the sixth and seventh elements of FIG. 5 signal vias and power vias are drilled, the signal vias being drilled through the signal plane but being insulated from the power plane, and the power vias being cut through the power plane, but insulated from the signal plane. The vias are then circuitized, as shown in the eighth element of FIG. 5, and laminated with a layer of adhesive therebetween, as shown in the ninth element of FIG. 5.

The structure has a flex cable formed of a layer of a low CTE metal, as Cu, Mo or a Cu/Invar/Cu laminate, bonded to a layer of a low dielectric constant material, as PTFE, PFA, or a perfluoroalkyl/silica composite. A metallization layer, for example, a signal layer, is present atop the fluorocarbon dielectric. The metallization layer surfaces are patterned, with circuitization on one side of the flex, and joining pads on the opposite side of the flex. Specifically, the method of our invention comprises forming a plurality of 1S1P subassemblies, and laminating them to form 2S2P circuitized flexible strip subassemblies. The 2S2P subassemblies are laminated to form the package. The process includes the steps of forming a laminate of a Cu signal plane, a conductive power plane, and a layer of dielectric therebetween. This laminate is than coated with photoresist and the photoresist is imaged to define fiducials, vias, and through holes thereon. Next clearance holes are formed for vias and through holes in the power and signal planes. The laminate is than relaminated and vias and through holes are formed through the relaminated laminate. The joining areas of the panel will be bonded together with the copper signal wires covered with a layer of dielectric before bonding. The portions of the panels intended to be bonded to form the laminate have vias and through holes drilled in them. Metal deposited in the drilled vias and through holes, to provide electrical contact between non-coplanar signal wires.

Figure 3:
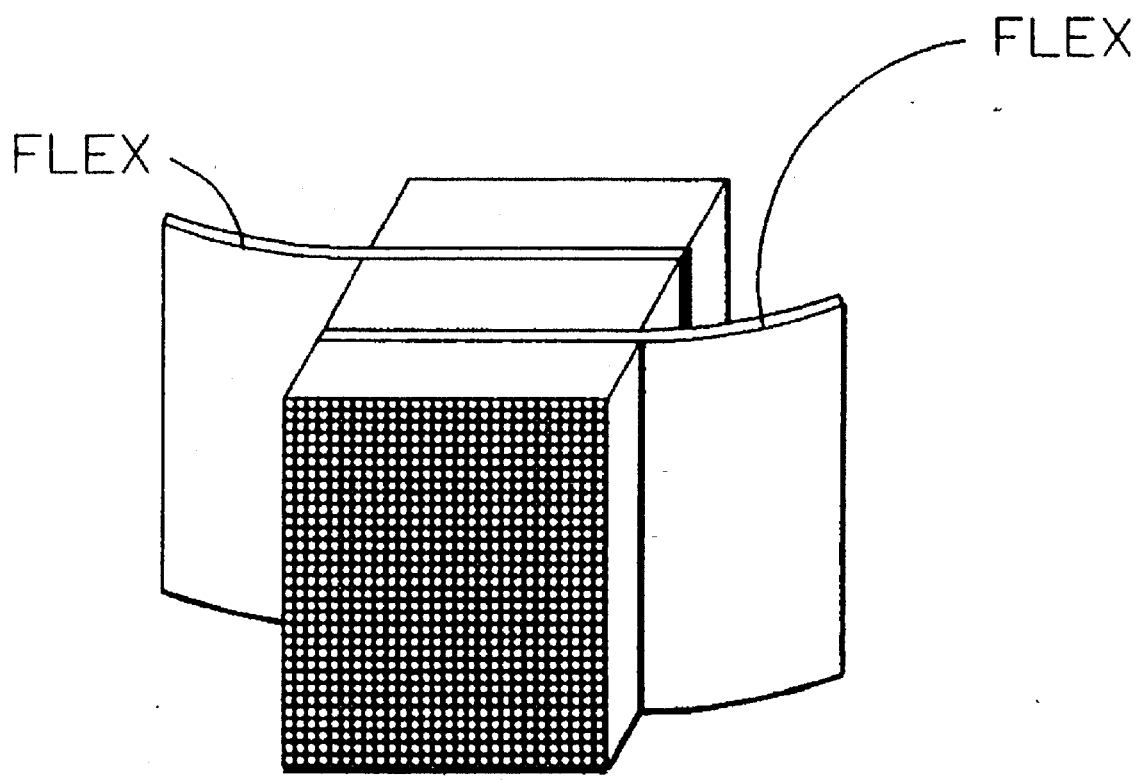
FIG. 3 shows the lamination of circuitized flexible strips to form a laminate with free portions.

The circuitized subassemblies are than stacked, with flex cable portions extending outwardly from the central portion, as shown in FIG. 3. The center portion is than compressed to bond the layers. Bonding may be by organic adhesion of the dielectric and/or by transient liquid phase metal bonding of the conductor pads and lands.

The method of fabrication has the process sequence shown in FIG. 5. In the first step, a conductive material, as Cu, a dielectric, as PTFE or PFA, and a second conductive material, as a Copper/Invar/Copper foil or a Molybdenum foil, are laminated together to form a blank core. Photoresist is than applied to both sides of the blank core. Both surfaces of the blank core are than photolithographically imaged, as illustrated in FIG. 5. Photolithographic imaging includes imaging of the alignment fiducials. Specifically, alignment fiducials are etched into the power core with reference to the clearance holes and in alignment to features in the signal layer, as illustrated in FIG. 5. The core blank is than etched, as shown in FIG. 5. After etching the resist covering is removed from both sides.

In the next processing step the core is relaminated. The core is than enclosed with another dielectric and a cover sheet. The cover sheet is etched and the dielectric covering the power core alignment fiducials is removed. The fiducials are than used to align the core to a punch or drill, as shown in FIG. 5. The signal side faces the punch or drill, and the power side faces away from the punch or drill, although the structure can be turned end over end, with the power core facing the punch or drill.

Power plane connections are made, as shown in FIG. 5. The core is next treated with a seed layer and a flash plate, and photolithographically imaged. This brings the buried signal circuitry to the top surface of the structure so that interlevel connections can be made.

A triplate can be formed from the above structure by either of two methods. In the first method the signal side image is different from the power side. This allows a plating coat to cover the surface and form a ground plane or isolation barrier that encloses the signal circuitry with ground or power planes that are equidistant from the signal plane.

Alternatively, a half thickness of dielectric can be applied atop the circuit layer of the 1S1P structure, and another one half thickness can be placed over the power layer of its mating 1S1P structure. In this way, upon lamination the original power planes enclose the signal layer, and are equidistant from the signal layer.

The subassemblies are than assembled. This results in a true triplate structure.

While the invention has been described with respect to certain preferred embodiments and exemplifications, it is not intended to limit the scope of the invention, but solely by the claims appended hereto.

We claim:

1. A method of fabricating a parallel processor structure having a plurality of processor integrated circuit chips, a plurality of memory integrated circuit chips, with signal interconnection circuitization means therebetween, wherein a. the processor integrated circuit chips and the memory integrated circuited chips are mounted on a plurality of printed circuit cards and boards with a first processor integrated circuit printed circuit board having a first processor integrated circuit chip mounted thereon, a second processor integrated circuit printed circuit board having a second processor integrated circuit chip mounted thereon, a first memory integrated circuit printed circuit board having a first memory integrated circuit chip mounted thereon, and a second memory integrated circuit printed circuit board having a second memory integrated circuit chip mounted thereon;

b. said printed circuit cards and boards are mounted on a plurality of circuitized flexible strips, said circuitized flexible strips comprising at least one 1S1P ply having an internal signal core, and internal power core, and a layer of dielectric therebetween, and having a signal interconnection circuitization portion with X–Y planar circuitization and vias and through holes for Z-axis circuitization, a terminal portion having means for joining a printed circuit board thereto, and a flexible, circuitized portion between said signal interconnection circuitization portion and said terminal portion, and c. said circuitized flexible strips being joined at a signal interconnection circuitization body portion having X-axis, Y-axis, and Z-axis signal interconnection between processor integrated circuit chips and memory integrated circuit chips and comprising a laminate of said circuitized flexible strips at their signal interconnection circuitization portions, whereby said circuitized flexible strips are laminated in physical and electrical connection at their signal interconnection circuitization portions and spaced apart at their terminal portions;

said process comprising

1). forming a laminate of a Cu signal plane, a conductive power plane, and a layer of dielectric therebetween;

2). depositing photoresist on both surfaces of said laminate;

3). imaging the photoresist to define fiducials, vias, and through holes thereon;

4). forming clearance holes for vias and through holes in the power and signal planes of the laminate;

5). applying dielectric sheets atop exposed metal surfaces of the laminate to thereby relaminate the laminate;

6). drilling signal and power through holes and vias through the laminate;

7). circuitizing the signal and power vias of the laminate;

8). laminating a pair of laminates to form a 2S2P circuitized flex circuit; and

9). stacking a plurality of circuitized flex circuits, and compressing and bonding only center portions thereof to form a package with X, Y, and Z axis circuitization.

2. The method of claim 1 wherein the power plane is chosen from the group consisting of Cu, Mo, and Cu/Invar/Cu laminate.

3. The method of claim 1 comprising after step 5), applying dielectric sheets atop exposed metal surfaces of the laminate, first seeding and flash plating the laminate, and thereafter drilling the laminate.

* * * * *